United States Patent
Hamidovic et al.

(10) Patent No.: US 10,700,902 B1
(45) Date of Patent: Jun. 30, 2020

(54) MODIFYING A SAMPLING FREQUENCY IN A RADIO FREQUENCY DIGITAL TO ANALOG CONVERTER

(71) Applicant: Intel Corporation, Santa Clara, CA (US)

(72) Inventors: Damir Hamidovic, Linz (AT); Christian Mayer, Wilhering (AT); Jovan Markovic, Linz (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/353,328

(22) Filed: Mar. 14, 2019

(51) Int. Cl.
*H04B 1/04* (2006.01)
*H04L 27/12* (2006.01)

(52) U.S. Cl.
CPC .................................. *H04L 27/122* (2013.01)

(58) Field of Classification Search
CPC ...... H04B 1/04; H04B 1/0475; H04B 1/0014; H04B 1/0025; H04B 1/0082; H04L 27/00; H04L 27/34; H04L 27/36; H04L 27/122
See application file for complete search history.

(56) References Cited

U.S. PATENT DOCUMENTS

| | | | | |
|---|---|---|---|---|
| 5,978,420 | A * | 11/1999 | Koslov | H04L 27/2071 332/103 |
| 6,973,146 | B1 * | 12/2005 | Barnette | H04B 3/23 375/355 |
| 8,233,412 | B1 | 7/2012 | Abbey et al. | |
| 9,276,617 | B2 | 3/2016 | Schafferer et al. | |
| 9,413,394 | B1 | 8/2016 | Lye et al. | |
| 2011/0069784 | A1 * | 3/2011 | Petilli | H04B 1/001 375/296 |
| 2018/0019862 | A1 * | 1/2018 | Kliewer | H04L 27/12 |

* cited by examiner

*Primary Examiner* — Thanh C Le
(74) *Attorney, Agent, or Firm* — 2SPL Patent Attorneys

(57) ABSTRACT

A communication system using an increased sampling rate includes a baseband signal generator and a PLL that generates an LO signal and an inverted LO signal. An interpolator generates an interpolated/delayed data stream from a baseband original data stream, and a cell control circuit generate control signals based on the interpolated data stream and the baseband original data stream. An RFDAC generates an RF output signal from the baseband signal using an increased sampling rate, the LO signal, the inverted LO signal, and the control signals.

11 Claims, 13 Drawing Sheets

MODIFYING A SAMPLING FREQUENCY IN A RADIO FREQUENCY DIGITAL TO ANALOG CONVERTER

FIELD

Various embodiments generally relate to the field of signal generation.

BACKGROUND

Communication systems typically use a local oscillator (LO) clock signal for generating signals for transmission and receiving signals.

For transmission, the LO signal can be used to upconvert a baseband signal into a radio frequency (RF) signal and then the RF signal can be transmitted using an antenna. For reception, an RF signal is received and the LO signal can be used to downconvert the received signal into a received baseband signal. The LO signal is typically generated using a digitally controlled oscillator (DCO).

It is appreciated that errors in generation of LO signals and transmission and reception can add or increase noise levels and the like.

Techniques are needed that facilitate communication system operation while mitigating generation of noise.

DETAILED DESCRIPTION

Figure 1:
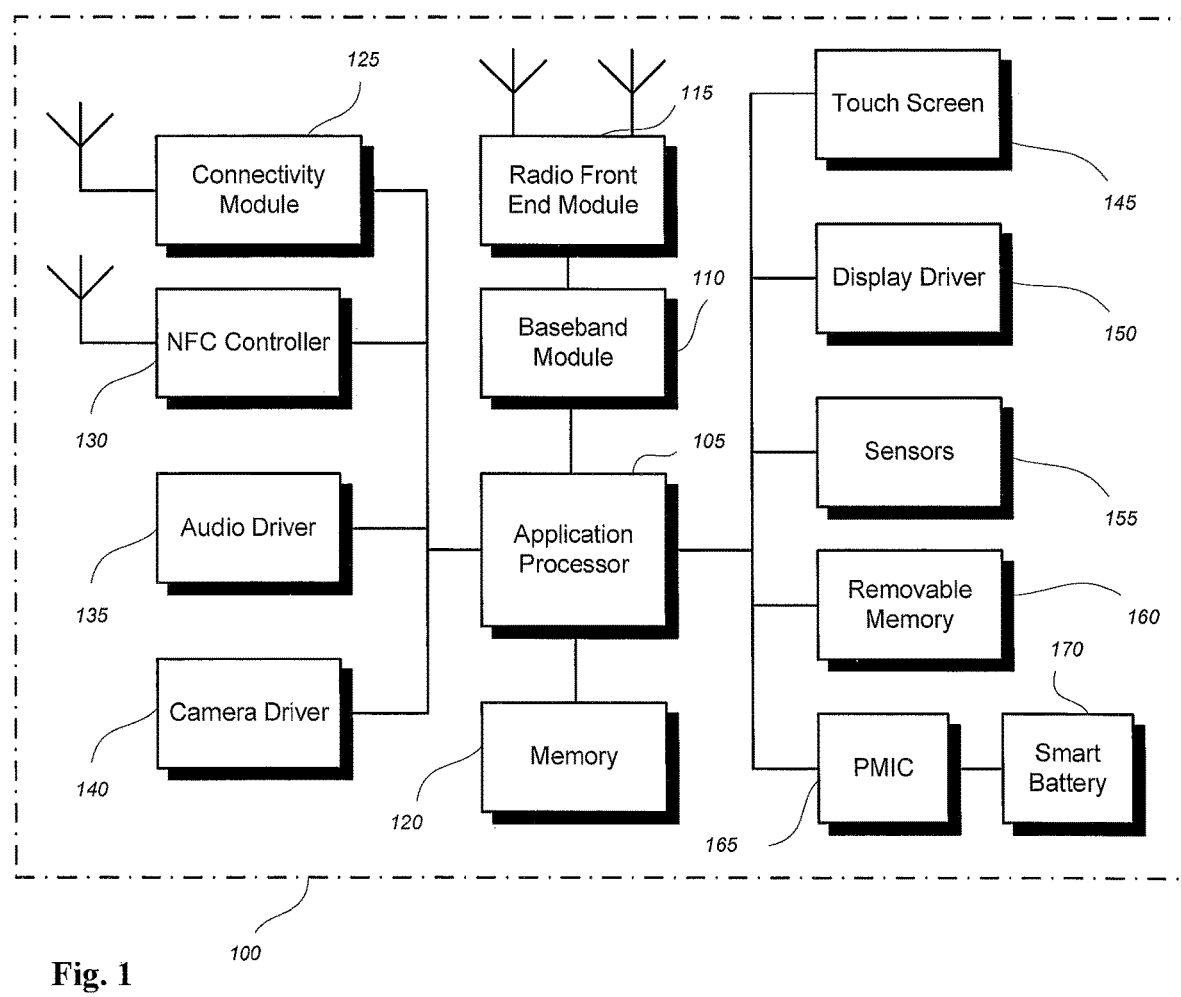
FIG. 1 illustrates an exemplary user device in accordance with an aspect.

The present disclosure will now be described with reference to the attached drawing figures, wherein like reference numerals are used to refer to like elements throughout, and wherein the illustrated structures and devices are not necessarily drawn to scale. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail. Embodiments herein may be related to RAN1 and 5G.

As utilized herein, terms "component," "system," "interface," and the like are intended to refer to a computer-related entity, hardware, software (e.g., in execution), and/or firmware. For example, a component can be a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, to the extent that the terms "including", "includes", "having", "has", "with", or variants thereof are used in either the detailed description and the claims, such terms are intended to be inclusive in a manner similar to the term "comprising".

It is appreciated that in digital intensive transmitter architectures, a carrier signal is a local oscillator (LO) clock signal generated by a digitally controlled oscillator (DCO). The DCO generates a DCO signal that generally works on multiple of $f_c$ (for instance $2f_c$ or $4f_c$), which means that DCO frequency can be affected by replicas of baseband signals (e.g., 2H, 4H) due to remodulation effects (e.g., electromagnetic coupling). The remodulation effects can result in degraded in-band error vector magnitude (EVM) and out-of-band performance (especially adjacent channel leakage ratio (ACLR) of an output RF signal. The degraded performance can become relatively severe or critical for communication systems, such as modern cellular systems (4G/LTE-LTE-CA, 5G/NR) and the like.

Embodiments are disclosed that facilitate suppression of all even replicas of a digital baseband signal (2H, 4H, etc.), appearing in RF signal on $2nf_c$ and reduce self-pulling (remodulation) affectability (n= . . . −2, −1, 0, 1, 2, . . . , $f_c$ is a carrier frequency).

Moreover, the embodiments can improve quantization noise-floor (e.g., by 3 dB) with the same bit-resolution of the RFDAC, which directly improves in-band (EVM), and out-of-band performances (ACLR, far-off noise). Furthermore, the 3 dB improvement of the noise floor could potentially lead to a lower bit-resolution of the RFDAC needed or used.

FIG. 1 illustrates a user device 100 in accordance with an aspect. The user device 100 may be a mobile device or a wearable device in some aspects and includes an application processor 105, baseband processor 110 (also referred to as a baseband module), radio front end module (RFEM) 115, memory 120, connectivity module 125, near field communication (NFC) controller 130, audio driver 135, camera driver 140, touch screen 145, display driver 150, sensors 155, removable memory 160, power management integrated circuit (PMIC) 165 and smart battery 170. The user device 100 can include and/or be incorporated with human proximity sensing circuitry.

In some aspects, application processor 105 may include, for example, one or more CPU cores and one or more of cache memory, low drop-out voltage regulators (LDOs), interrupt controllers, serial interfaces such as serial peripheral interface (SPI), inter-integrated circuit ($I^2C$) or universal programmable serial interface module, real time clock (RTC), timer-counters including interval and watchdog timers, general purpose input-output (IO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 110 may be implemented, for example, as a solder-down substrate including one or more integrated circuits, a single packaged integrated circuit soldered to a main circuit board, and/or a multi-chip module containing two or more integrated circuits.

Figure 2:
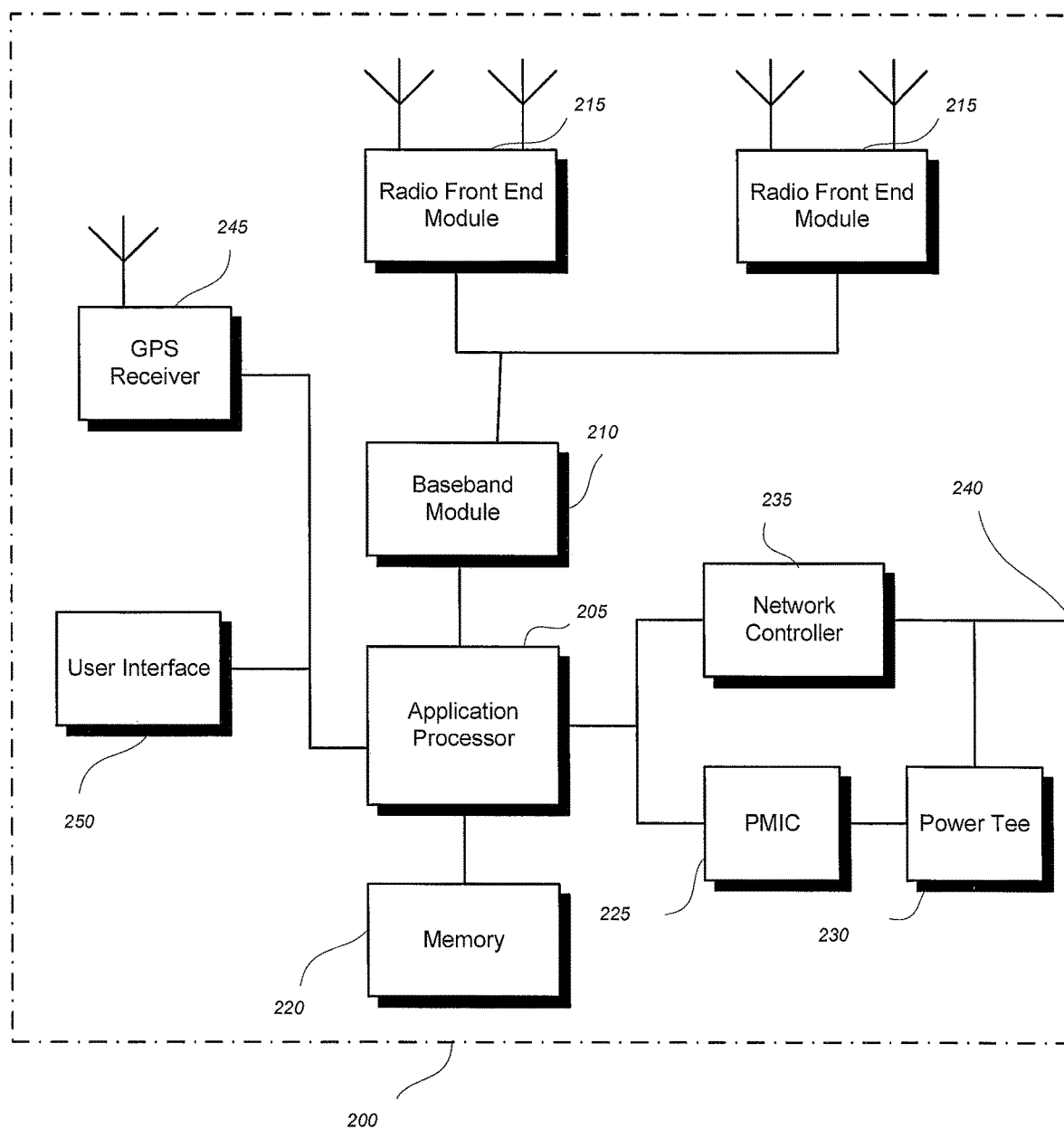
FIG. 2 illustrates an exemplary base station or infrastructure equipment radio head in accordance with an aspect.

FIG. 2 illustrates a base station or infrastructure equipment radio head 200 in accordance with an aspect. The base station radio head 200 may include one or more of application processor 205, baseband modules 210, one or more radio front end modules 215, memory 220, power management circuitry 225, power tee circuitry 230, network controller 235, network interface connector 240, satellite navigation receiver module 245, and user interface 250.

In some aspects, application processor 205 may include one or more CPU cores and one or more of cache memory, low drop-out voltage regulators (LDOs), interrupt controllers, serial interfaces such as SPI, $I^2C$ or universal programmable serial interface module, real time clock (RTC), timer-counters including interval and watchdog timers, general purpose IO, memory card controllers such as SD/MMC or similar, USB interfaces, MIPI interfaces and Joint Test Access Group (JTAG) test access ports.

In some aspects, baseband processor 210 may be implemented, for example, as a solder-down substrate including one or more integrated circuits, a single packaged integrated circuit soldered to a main circuit board or a multi-chip module containing two or more integrated circuits.

In some aspects, memory 220 may include one or more of volatile memory including dynamic random access memory (DRAM) and/or synchronous dynamic random access memory (SDRAM), and nonvolatile memory (NVM) including high-speed electrically erasable memory (commonly referred to as Flash memory), phase change random access memory (PRAM), magnetoresistive random access memory (MRAM) and/or a three-dimensional crosspoint memory. Memory 220 may be implemented as one or more of solder down packaged integrated circuits, socketed memory modules and plug-in memory cards.

In some aspects, power management integrated circuitry 225 may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, power tee circuitry 230 may provide for electrical power drawn from a network cable to provide both power supply and data connectivity to the base station radio head 200 using a single cable.

In some aspects, network controller 235 may provide connectivity to a network using a standard network interface protocol such as Ethernet. Network connectivity may be provided using a physical connection which is one of electrical (commonly referred to as copper interconnect), optical or wireless.

In some aspects, satellite navigation receiver module 245 may include circuitry to receive and decode signals transmitted by one or more navigation satellite constellations such as the global positioning system (GPS), Globalnaya Navigatsionnaya Sputnikovaya Sistema (GLONASS), Galileo and/or BeiDou. The receiver 245 may provide data to application processor 205 which may include one or more of position data or time data. Application processor 205 may use time data to synchronize operations with other radio base stations.

In some aspects, user interface 250 may include one or more of physical or virtual buttons, such as a reset button, one or more indicators such as light emitting diodes (LEDs) and a display screen.

It is appreciated that the radio head 200 can also include a single RF front end module, including a single RF front end module for MIMO.

Figures 3A, 3B:
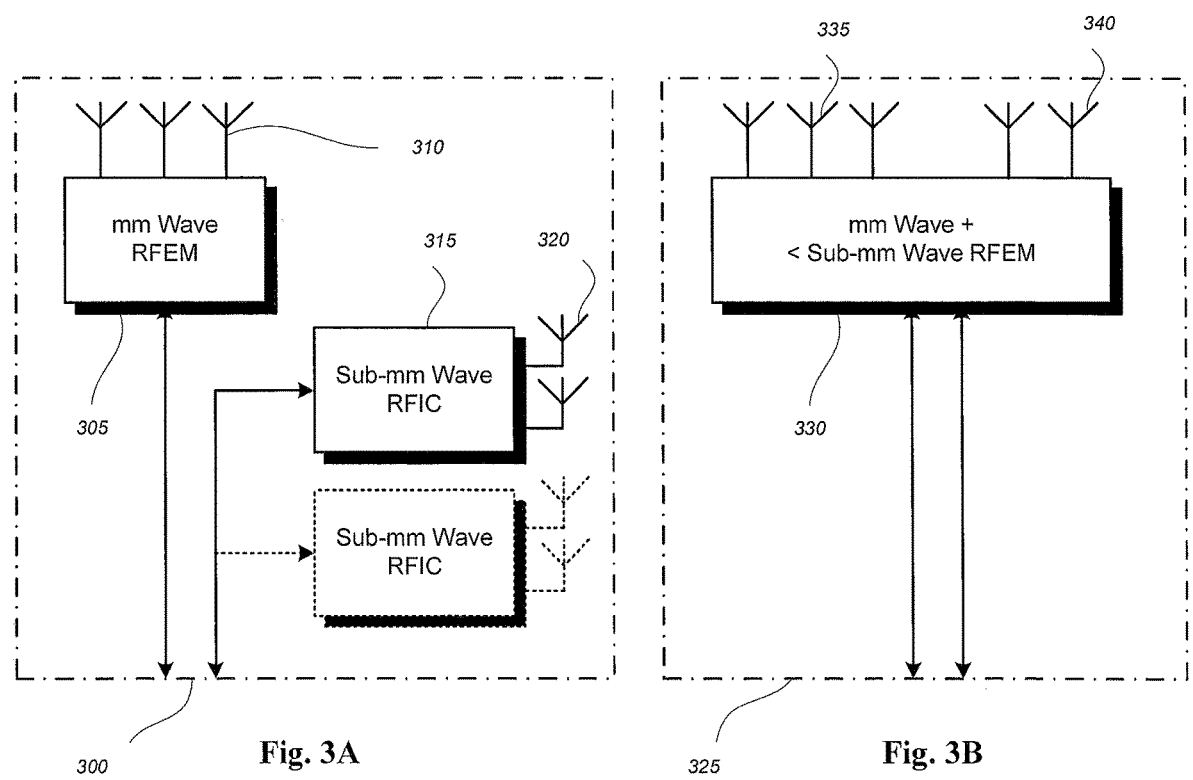
FIG. 3A and FIG. 3B illustrate aspects of an exemplary radio front end module.

FIG. 3A and FIG. 3B illustrate aspects of a radio front end module.

FIG. 3A illustrates an aspect of a radio front end module 300 incorporating a millimeter wave radio front end module (RFEM) 305 and one or more sub-millimeter wave radio frequency integrated circuits (RFIC) 315. In this aspect, the one or more sub-millimeter wave RFICs 315 may be physically separated from a millimeter wave RFEM 305. RFICs 315 may include connection to one or more antennas 320. RFEM 305 may be connected to multiple antennas 310.

FIG. 3B illustrates an alternate aspect of a radio front end module 325. In this aspect, both millimeter wave and sub-millimeter wave radio functions may be implemented in the same physical radio front end module 330. RFEM 330 may incorporate both millimeter wave antennas 335 and sub-millimeter wave antennas 340.

Figure 4A:
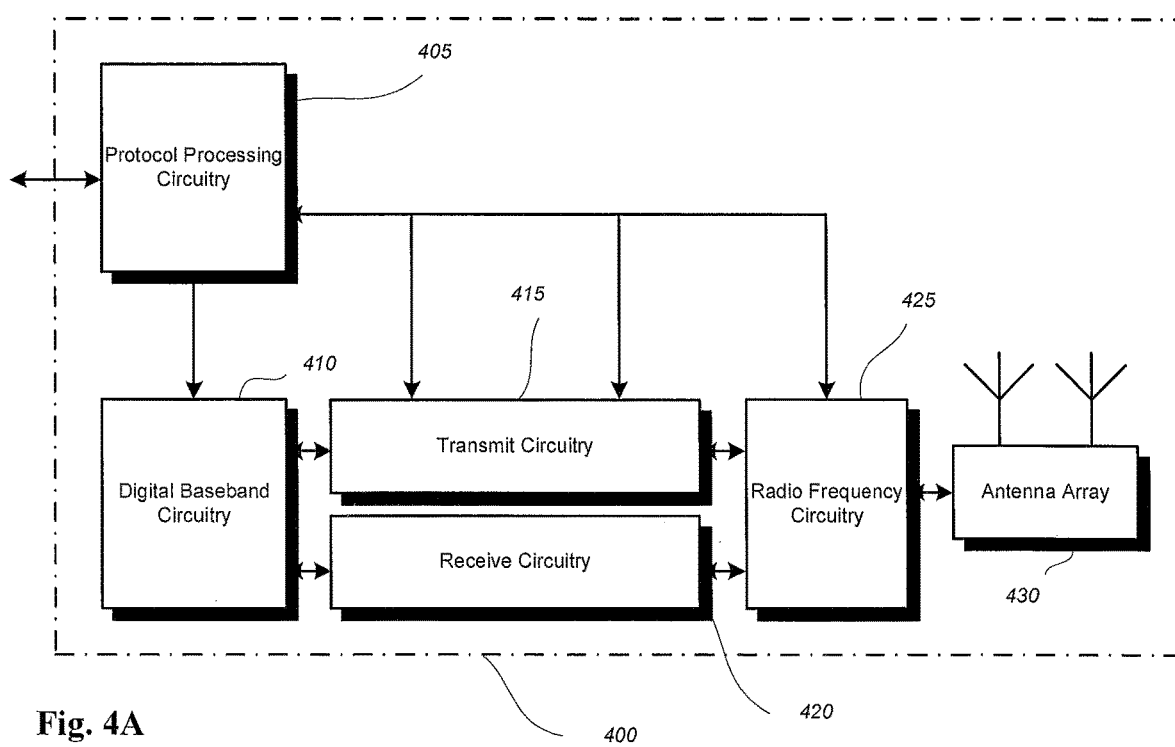
FIG. 4A illustrates an exemplary millimeter wave communication circuitry 400 according to some aspects.

FIG. 4A illustrates an exemplary millimeter wave communication circuitry 400 according to some aspects. Circuitry 400 is alternatively grouped according to functions. Components as shown in 400 are shown here for illustrative purposes and may include other components not shown here in FIG. 4A.

Millimeter wave communication circuitry 400 may include protocol processing circuitry 405, which may implement one or more of medium access control (MAC), radio link control (RLC), packet data convergence protocol (PDCP), radio resource control (RRC) and non-access stratum (NAS) functions. Protocol processing circuitry 405 may include one or more processing cores (not shown) to execute instructions and one or more memory structures (not shown) to store program and data information.

Millimeter wave communication circuitry 400 may further include digital baseband circuitry 410, which may implement physical layer (PHY) functions including one or more of hybrid automatic repeat request (HARQ) functions, scrambling and/or descrambling, coding and/or decoding, layer mapping and/or de-mapping, modulation symbol mapping, received symbol and/or bit metric determination, multi-antenna port pre-coding and/or decoding which may include one or more of space-time, space-frequency or spatial coding, reference signal generation and/or detection, preamble sequence generation and/or decoding, synchronization sequence generation and/or detection, control channel signal blind decoding, and other related functions.

Millimeter wave communication circuitry 400 may further include transmit circuitry 415, receive circuitry 420 and/or antenna array circuitry 430.

Millimeter wave communication circuitry 400 may further include radio frequency (RF) circuitry 425. In an aspect of the invention, RF circuitry 425 may include multiple parallel RF chains for one or more of transmit or receive functions, each connected to one or more antennas of the antenna array 430.

In an aspect of the disclosure, protocol processing circuitry 405 may include one or more instances of control circuitry (not shown) to provide control functions for one or more of digital baseband circuitry 410, transmit circuitry 415, receive circuitry 420, and/or radio frequency circuitry 425.

Figure 4B:
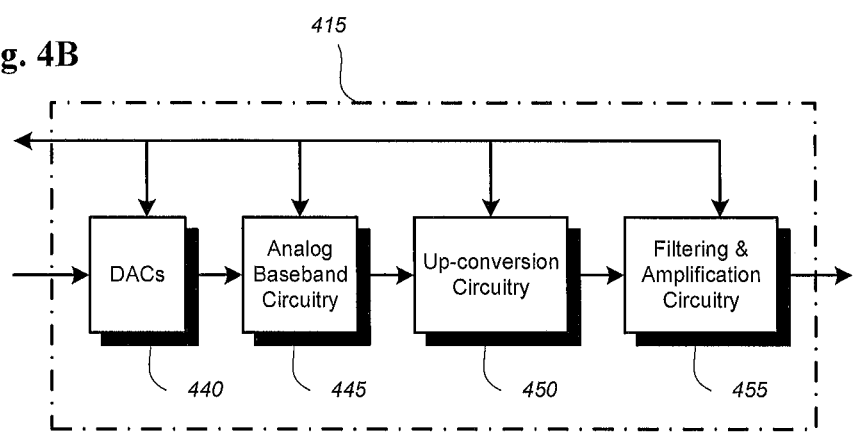
FIGS. 4B and 4C illustrate examples for transmit circuitry in FIG. 4A in some aspects.
Figure 4C:
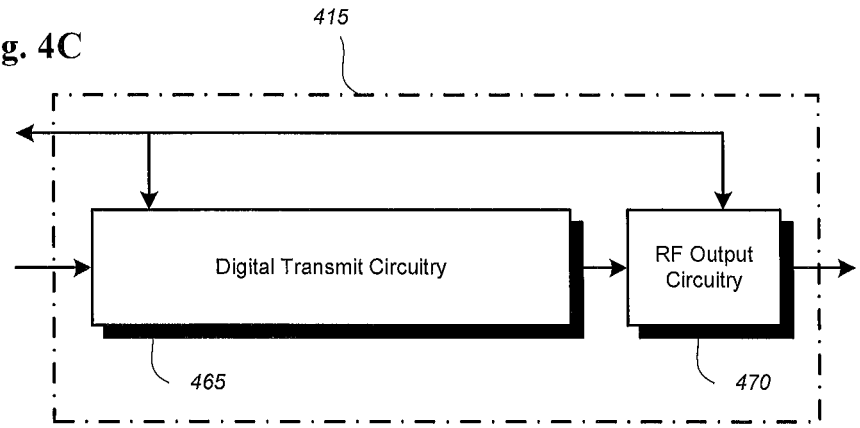

FIGS. 4B and 4C illustrate examples for transmit circuitry 415 in FIG. 4A in some aspects.

The exemplary transmit circuitry 415 of FIG. 4B may include one or more of digital to analog converters (DACs) 440, analog baseband circuitry 445, up-conversion circuitry 450 and filtering and amplification circuitry 455. In another aspect, FIG. 4C illustrates an exemplary transmit circuitry 415 which includes digital transmit circuitry 465 and output circuitry 470.

Figure 4D:
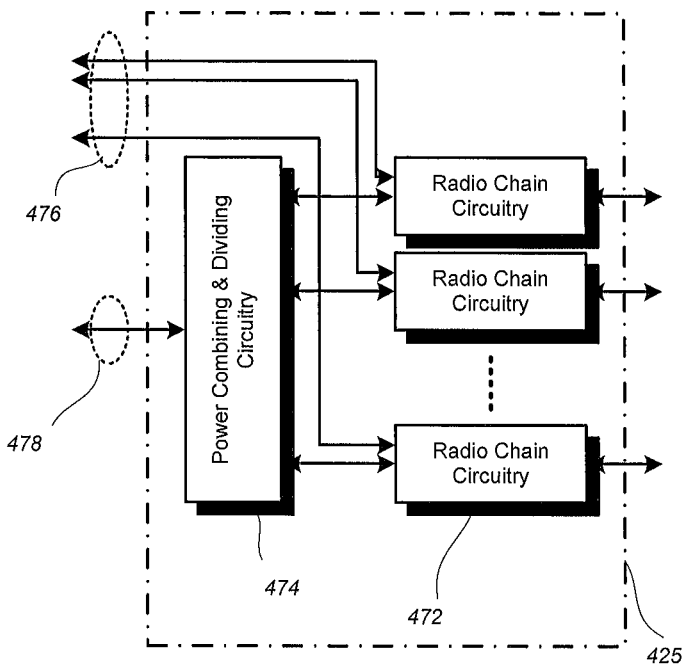
FIG. 4D illustrates an exemplary radio frequency circuitry in FIG. 4A according to some aspects.

FIG. 4D illustrates an exemplary radio frequency circuitry 425 in FIG. 4A according to some aspects.

Radio frequency circuitry 425 may include one or more instances of radio chain circuitry 472, which in some aspects may include one or more filters, power amplifiers, low noise amplifiers, programmable phase shifters and power supplies (not shown).

Radio frequency circuitry 425 may include power combining and dividing circuitry 474 in some aspects. In some aspects, power combining and dividing circuitry 474 may operate bidirectionally, such that the same physical circuitry may be configured to operate as a power divider when the device is transmitting, and as a power combiner when the device is receiving. In some aspects, power combining and dividing circuitry 474 may one or more include wholly or partially separate circuitries to perform power dividing when the device is transmitting and power combining when the device is receiving. In some aspects, power combining and dividing circuitry 474 may include passive circuitry comprising one or more two-way power divider/combiners arranged in a tree. In some aspects, power combining and dividing circuitry 474 may include active circuitry comprising amplifier circuits.

In some aspects, radio frequency circuitry 425 may connect to transmit circuitry 415 and receive circuitry 420 in FIG. 4A via one or more radio chain interfaces 476 or a combined radio chain interface 478.

In some aspects, one or more radio chain interfaces 476 may provide one or more interfaces to one or more receive or transmit signals, each associated with a single antenna structure which may comprise one or more antennas.

In some aspects, the combined radio chain interface 478 may provide a single interface to one or more receive or transmit signals, each associated with a group of antenna structures comprising one or more antennas.

Figure 4E:
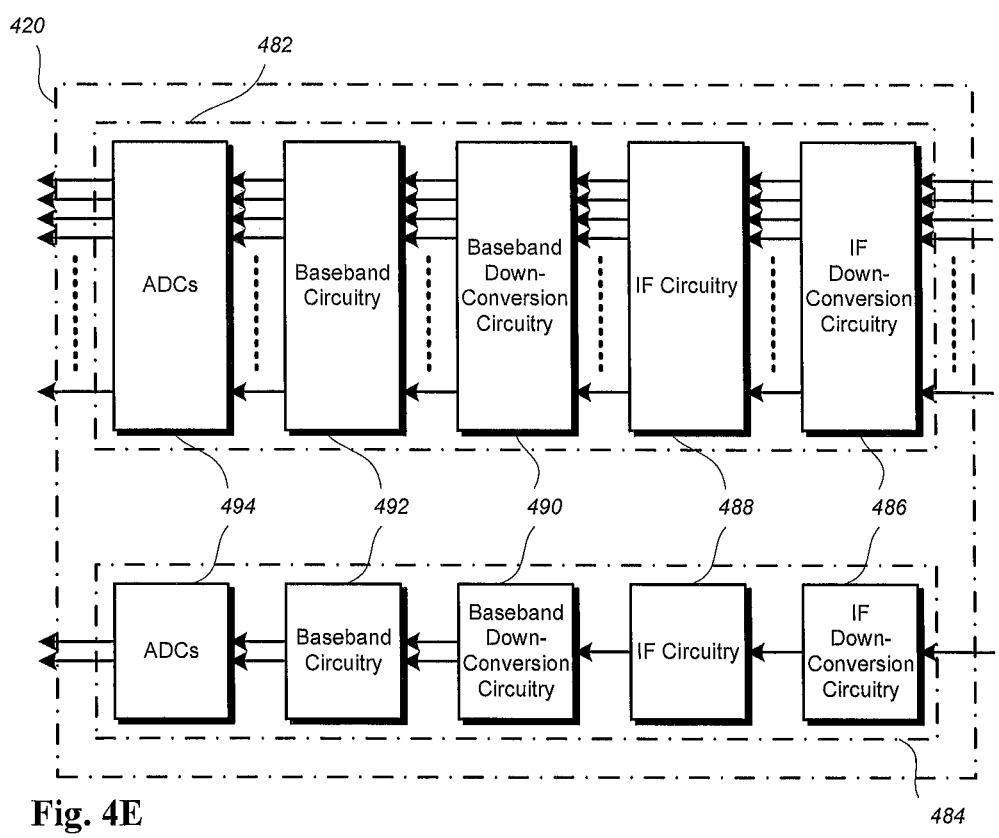
FIG. 4E illustrates exemplary receive circuitry in FIG. 4A according to some aspects.

FIG. 4E illustrates exemplary receive circuitry 420 in FIG. 4A according to some aspects. Receive circuitry 420 may include one or more of parallel receive circuitry 482 and/or one or more of combined receive circuitry 484.

In some aspects, the one or more parallel receive circuitry 482 and one or more combined receive circuitry 484 may include one or more Intermediate Frequency (IF) down-conversion circuitry 486, IF processing circuitry 488, baseband down-conversion circuitry 490, baseband processing circuitry 492 and analog-to-digital converter (ADC) circuitry 494.

Figure 5:
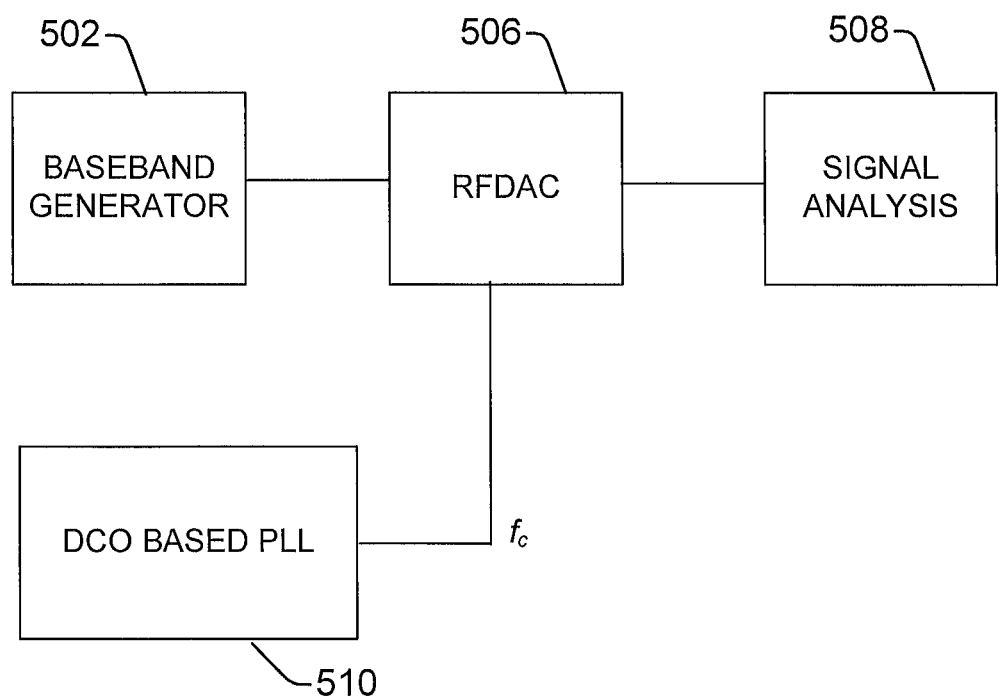
FIG. 5 is a diagram illustrating an arrangement for a transmitter system using an enhanced sampling frequency in accordance with some embodiments and/or aspects.

FIG. 5 is a diagram illustrating an arrangement for a transmitter system 500 using an enhanced sampling frequency in accordance with some embodiments and/or aspects. The system 500 is provided for illustrative purposes and it is appreciated that suitable variations of the system 500 are contemplated.

The system 500 can be implemented in front end circuitry, such as the radio front end module 115, the radio front end module 215, the radio front end module 300, the radio front end module 325 and variations thereof. Further, the system 500 can be used within or as a transmitter, such as the transmitter 415. The system 500 can be used with user device 100, a base station or infrastructure equipment radio head 200 and the like.

The system 500 includes a baseband signal generator circuit 502, an enhanced radio frequency digital to analog converter (RFDAC) 506, additional front end circuitry 508 and a phase locked loop (PLL) 510. The system 500 utilizes techniques to increase a sampling frequency without increasing the operational frequency of other blocks in a transmitter chain. This is achieved by controlling already existing parts of the RFDAC cell design by additionally introducing signals plus adding small digital processing blocks The signal generator circuit 502 can be or included as part of a digital front end (DFE), a baseband signal generator circuit and the like. The generator circuit 502 is configured to generate a baseband signal, which can be a quadrature signal having I and Q components, shown as $x_i(t)$ and $x_q(t)$.

The PLL 510 generates the LO signal and one or more additional signals based on the LO signal.

The RFDAC 506 is configured to convert an analog RF signal to a digital RF signal, which can be shown as $x_{RF}(t)$.

The additional circuitry 508 can include a power amplifier, antenna and the like.

The RFDAC 506 has an increased sampling frequency which is not utilized by other circuits or blocks in the system 500. The RFDAC 506 includes a cell control circuit (not shown) configured to increase the sampling frequency of its input signal, the analog RF signal.

In one example, the increased sampling frequency has the effect of increasing the digital sample rate by a factor of two. This increase improves a quantization noise floor by 3 dB, in one example, compared with other similar, but non sampling frequency increased RFDACs. Further, the increase can improve in and out of band performance, EVM, ACLR, far-off noise, and the like.

As stated above, the RFDAC 506 has an increased sampling frequency without increasing the operation frequency for other blocks of the transmitter system 500.

Generally, the magnitude of the baseband input signal (or its components as it is I and Q, for example) are updated on rising (or falling) edges of the LO clock signal. Typically, once per an LO cycle. Since the LO signal is operating on a carrier frequency $f_c$, the baseband signal is upsampled to the same frequency $f_s=f_c$. Thus, replicas of the digital input-baseband signal are on multiples of carrier frequency $nf_c$, where n= . . . −2, −1, 0, 1, 2, . . . (any integer number). After up-conversion to the carrier frequency $f_c$, the replicas are shifted by $\pm f_c$. Generally, the DCO within the PLL 510 also works on a multiple of $f_c$, usually $2f_c$, of $4f_c$ to generate the LO clock signal. Inherently, replicas of input digital signal (2H or 4H for example) due to the nature of the input digital signal. As stated above, the DCO works on and/or generates signals are multiples of the carrier frequency, such as $2f_c$, of $4f_c$, and can be affected by those replicas appearing on the same frequency. These replicas can affect the DCO by causing and/or generating unwanted frequency-components in the LO signal.

The upsampling within the RFDAC 506 can reduce the self-pulling (remodulation) by high suppression of the replicas of the digital input signal (2H, 4H, etc.) from the frequency range where DCO of the PLL 510 is working. It is appreciated that if the RFDAC 506 is configured to upsample its input signal to $2f_c$, replicas of digital-baseband signal are on $2nf_c$, or after upconversion, replicas would be on $(2n\pm1)f_c$, which means that on $2nf_c$, which are usually working frequencies for DCO, there would not be replicas of the digital signal in the ideal case (with ideal interpolation). The up-sampling to $2f_c$ means the magnitude of the baseband signal (or its components) is updated 2 times per one LO cycle. Additional values of the baseband signal in the middle of the LO cycle can be obtained by interpolation between already existing samples. To obtain the suppression of the replicas (by more than 35 dB), a $1^{st}$ order interpolation on an RF rate is sufficient/suitable.

Figure 6:
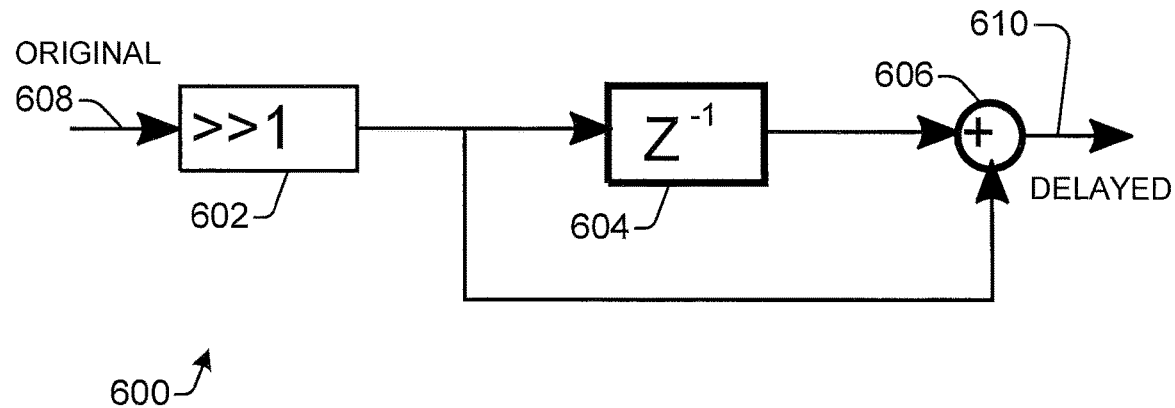
FIG. 6 is a diagram illustrating an interpolator in accordance with one or more embodiments.

FIG. 6 is a diagram illustrating an interpolator 600 in accordance with one or more embodiments. The interpolator 600 is provided as an example and it is appreciated that suitable variations are contemplated.

The interpolator 600 can be used with transmitters, such as the transmitter system 500 shown above. Further, the interpolator 600 can be used within the RFDAC 506 to interpolate a current sample with a previous sample. The interpolator 600 is a first order interpolator.

The interpolator 600 includes a one-bit shifter 602, a register 604 and an adder 606.

In operation, the one-bit shifter 602 shifts a sample by one bit. The register 604 stores the sample. The adder 606 adds or combines a stored sample from the register 604 with the shifted sample from the shifter 602. The stored sample is a previous sample. Thus, the adder 606 combines a current sample with a previous sample.

It is appreciated that other suitable interpolators are contemplated.

Figure 7:
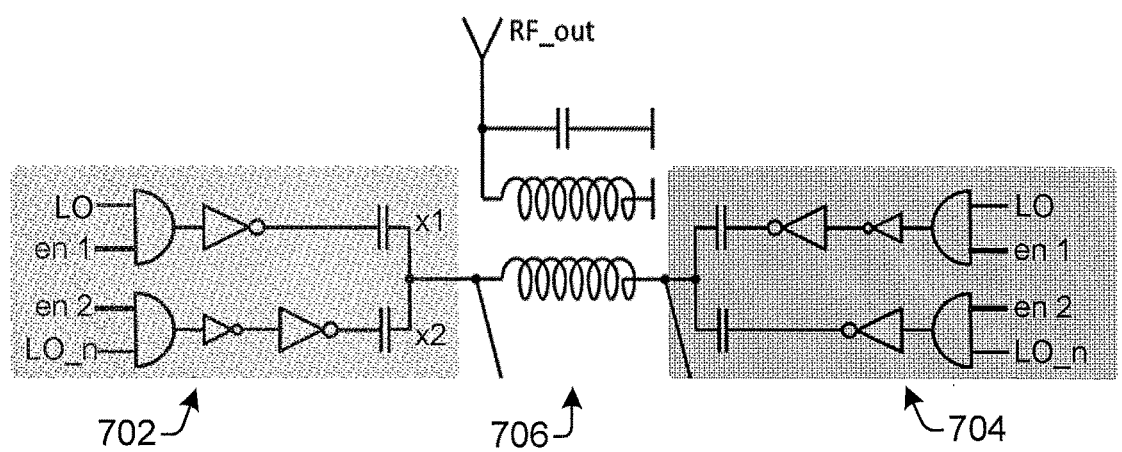
FIG. 7 is a diagram illustrating a modified cell structure that facilitates an increased sampling rate in accordance with one or more embodiments.

FIG. 7 is a diagram illustrating a modified cell structure 700 that facilitates an increased sampling rate in accordance with one or more embodiments. The cell structure 700 is provided as an example and it is appreciated that suitable variations are contemplated.

The modified structure 700 receives a LO signal and an inverted LO signal (shown as LO_n). The structure 700 is controlled by a first enable signal (en 1) and a second enable signal (en 2). The enable signals are generated by a cell controller and/or the like.

The structure includes a first cell structure 702, a second cell structure 704 and a transformer 706. The second cell structure 704 can be substantially similar to structure 702.

The structure 702 includes an upper path and a lower or inverted path. The upper path performs an AND operation on the LO and en 1 and inverts the ANDed output. The lower path performs an AND operation on the LO_n and the en 2, inverts the ANDed output and again inverts with a second inverter to generate the inverted path output.

The second structure 704 also includes an upper path and a lower or inverted path. The upper path performs an AND operation on the LO and en 1 and inverts the ANDed output. The lower path performs an AND operation on the LO_n and the en 2, inverts the ANDed output and again inverts with a second inverter to generate the inverted path output.

The second cell structure 704 can be omitted for some applications, such as where the RFDAC is single ended. If the RFDAC is differential, 702 and 704 are two sides of a differential structure.

The inverted path output is combined with the upper path output and provided to the transformer 706. The transformer 706 combines the output of the structure 702 with the output of the structure 704.

The structure 700 is configured to update the magnitude of a baseband signal twice per one LO cycle.

The control signals 'en 1' and 'en 2' can be controlled/changed separately by two independent data-streams ('original' and 'delayed/interpolated' data streams). This provides control of a first and a second half of the LO cycle (RF cycle). An example of the control signals and generated values are provided below with regards to FIG. 9.

Figure 8A:
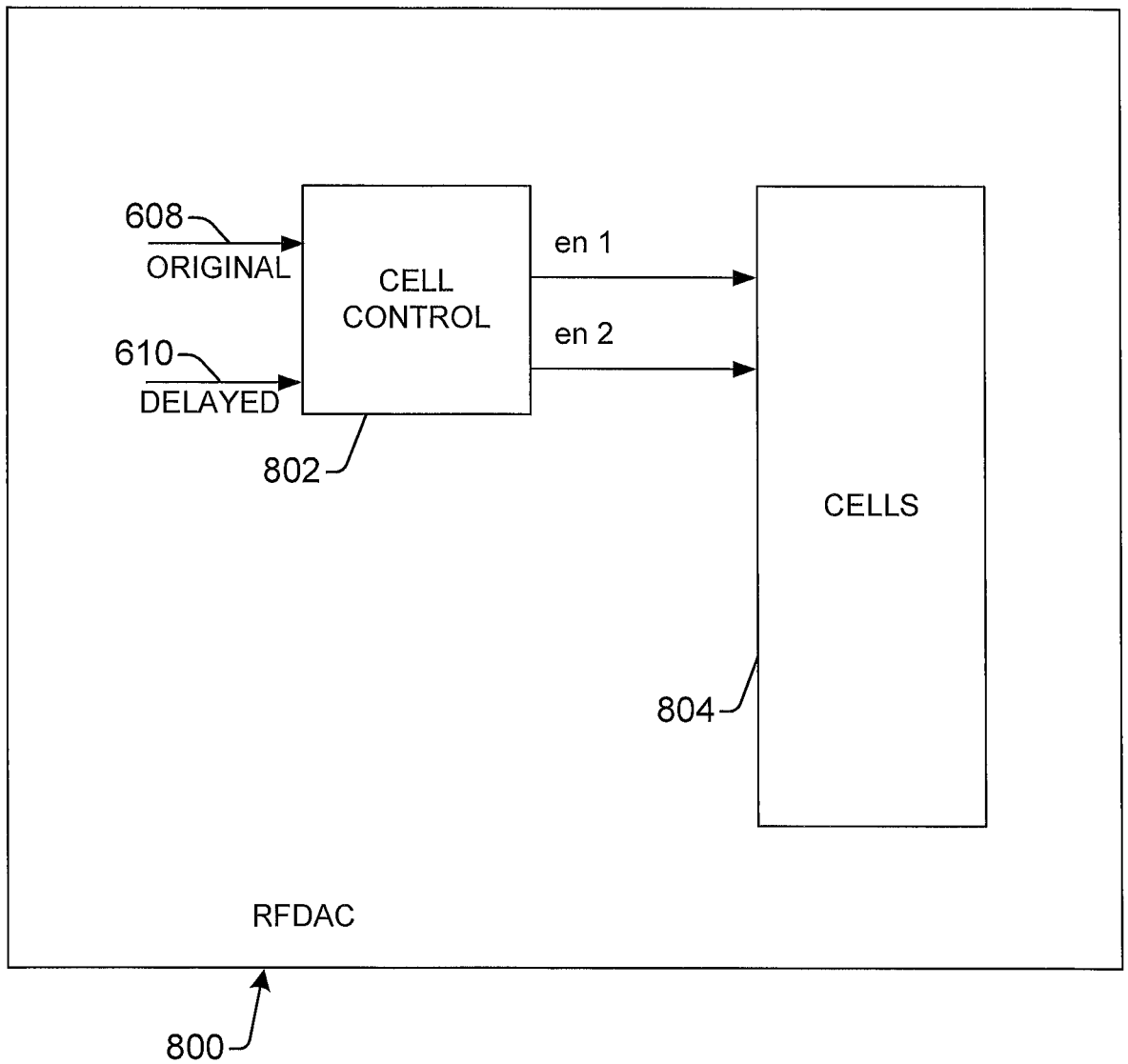
FIG. 8A is a diagram illustrating an increased sampling rate RFDAC in accordance with one or more embodiments.

FIG. 8A is a diagram illustrating an increased sampling rate RFDAC 800 in accordance with one or more embodiments. The RFDAC 800 is provided as an example for illustrative purposes. It is appreciated that suitable variations are contemplated.

The RFDAC 800 can be used with or as the RFDAC 506 shown above.

The RFDAC 800 includes a cell controller 802 and a cell structure 804.

The cell controller 802 generates control signals en 1 and en 2 based on an original baseband stream 608 and a delayed/interpolated data stream 610. The control signals are provided to the cell structure 804. The control signals can be controlled or changed separately based on independent data-streams. In this example, the independent data streams are 'original' and 'delayed or interpolated' data streams.

The structure 804 includes a plurality of cell structures, such as the structure 700 shown above.

Figure 8B:
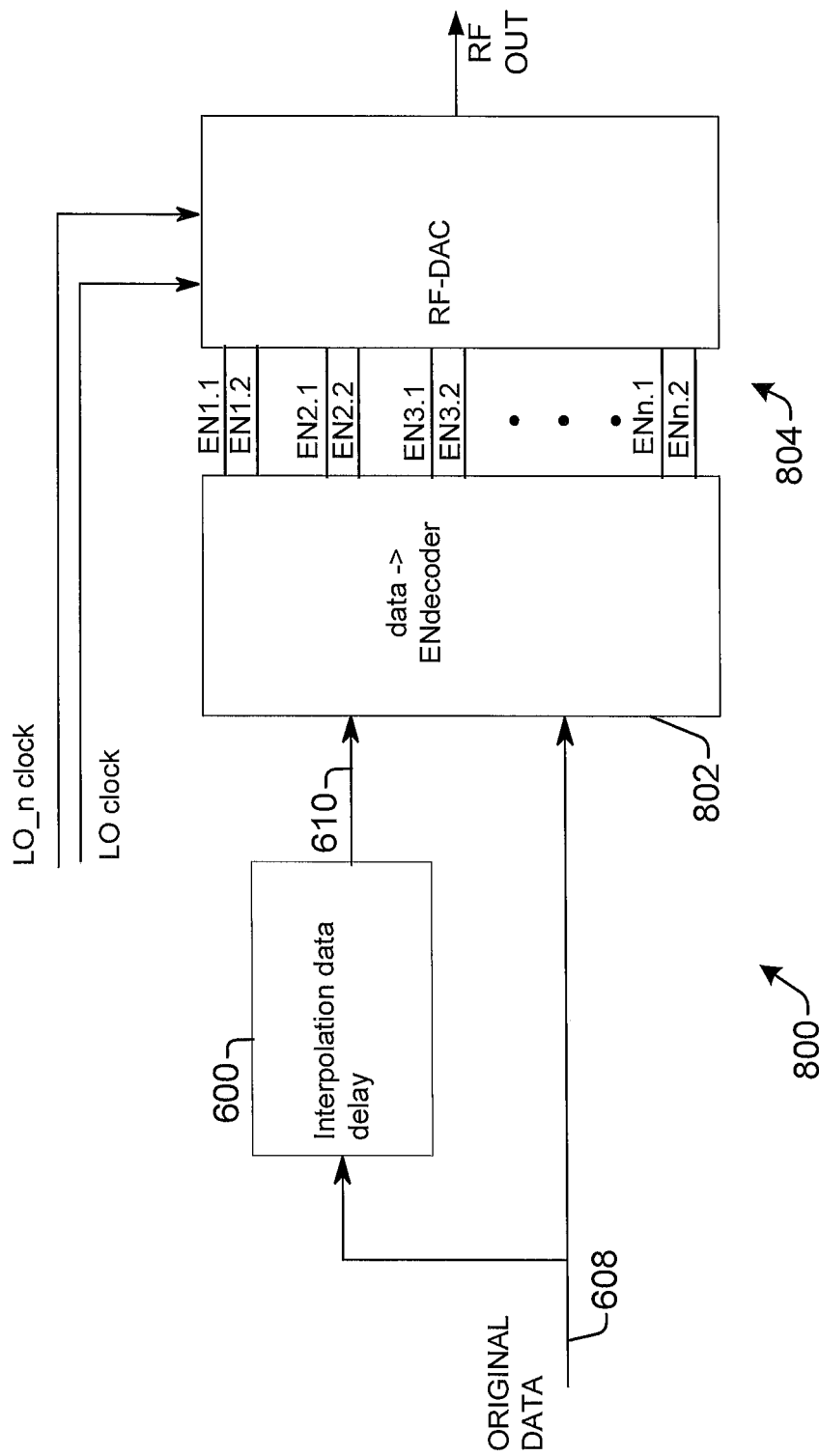
FIG. 8B is a diagram illustrating an increased sampling rate RFDAC in accordance with one or more embodiments.

FIG. 8B is a diagram illustrating an increased sampling rate RFDAC 800 in accordance with one or more embodiments. The RFDAC 800 is provided as an example for illustrative purposes. It is appreciated that suitable variations are contemplated.

The RFDAC 800 is shown including the interpolator 600, the cell controller 802 and a plurality of cells 804. The interpolator 600 receives an original baseband data stream 608 and generates a delayed/interpolated data stream 610.

The cell controller 802 receives the original data stream 608 and the delayed data stream 610 and generates a plurality of control signals for the plurality of cells. The control signals are based on the data streams 608 and 610.

The RFDAC 800 samples the data stream 608 with an increased sampling frequency, such as twice the carrier frequency to generate an RF output signal.

Figure 9:
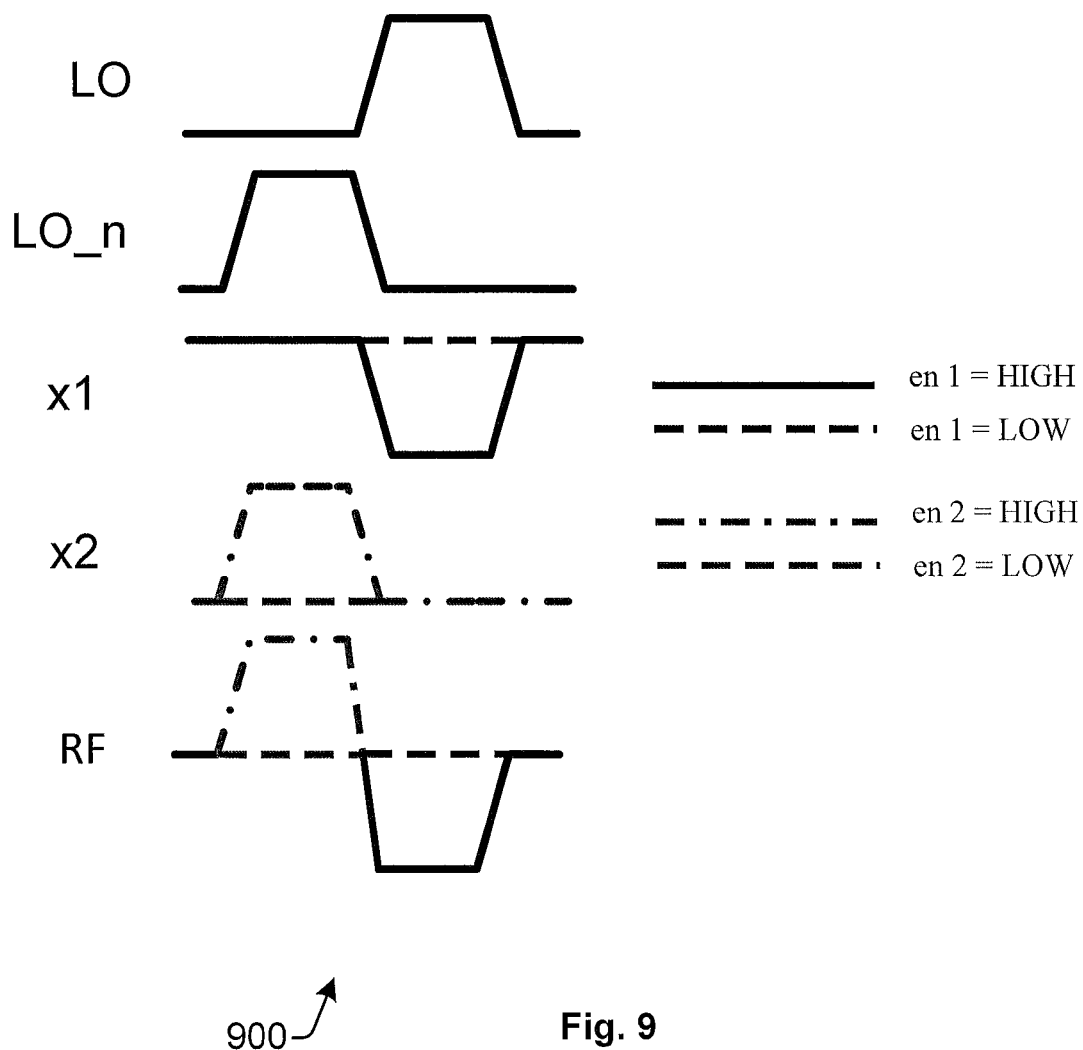
FIG. 9 is a graph showing various signals associated with an increased sampling rate cell structure in accordance with one or more embodiments.

FIG. 9 is a graph 900 showing various signals associated with an increased sampling rate cell structure in accordance with one or more embodiments. The graph 900 is provided as an example for illustrative purposes. It is appreciated that suitable variations are contemplated.

The cell structure in this example is the cell structure 700 shown above. The various signals include control signals (en 1 and en 2), cell structure outputs (x1 and x2), a LO signal (LO) and an inverted LO signal (LO_n) and an RF output signal (RF_out). FIG. 7 can also be referenced for the various signals.

An x-axis depicts time and a y-axis depicts signal magnitude. The graph 900 depicts a single LO cycle.

The inverted LO signal is shown as inverted with regard to the LO signal.

As it is shown in FIG. 9, the output x1 goes from HIGH to LOW as LO_n goes from HIGH to LOW if EN1 is HIGH-constant for entire clock cycle, and X1 stays HIGH for entire clock cycle if EN1 is LOW-constant for entire LO cycle.

The output X2 is HIGH when LO_n is HIGH and X2 is LOW when LO_n is LOW if EN2 is HIGH-constant for entire clock cycle. X2 stays LOW for entire clock cycle if EN2 is LOW.

The resulting RF signal is shown below the output x2. The RF (RF_out in FIG. 7) is a combination of x1 and x2.

Figure 10:
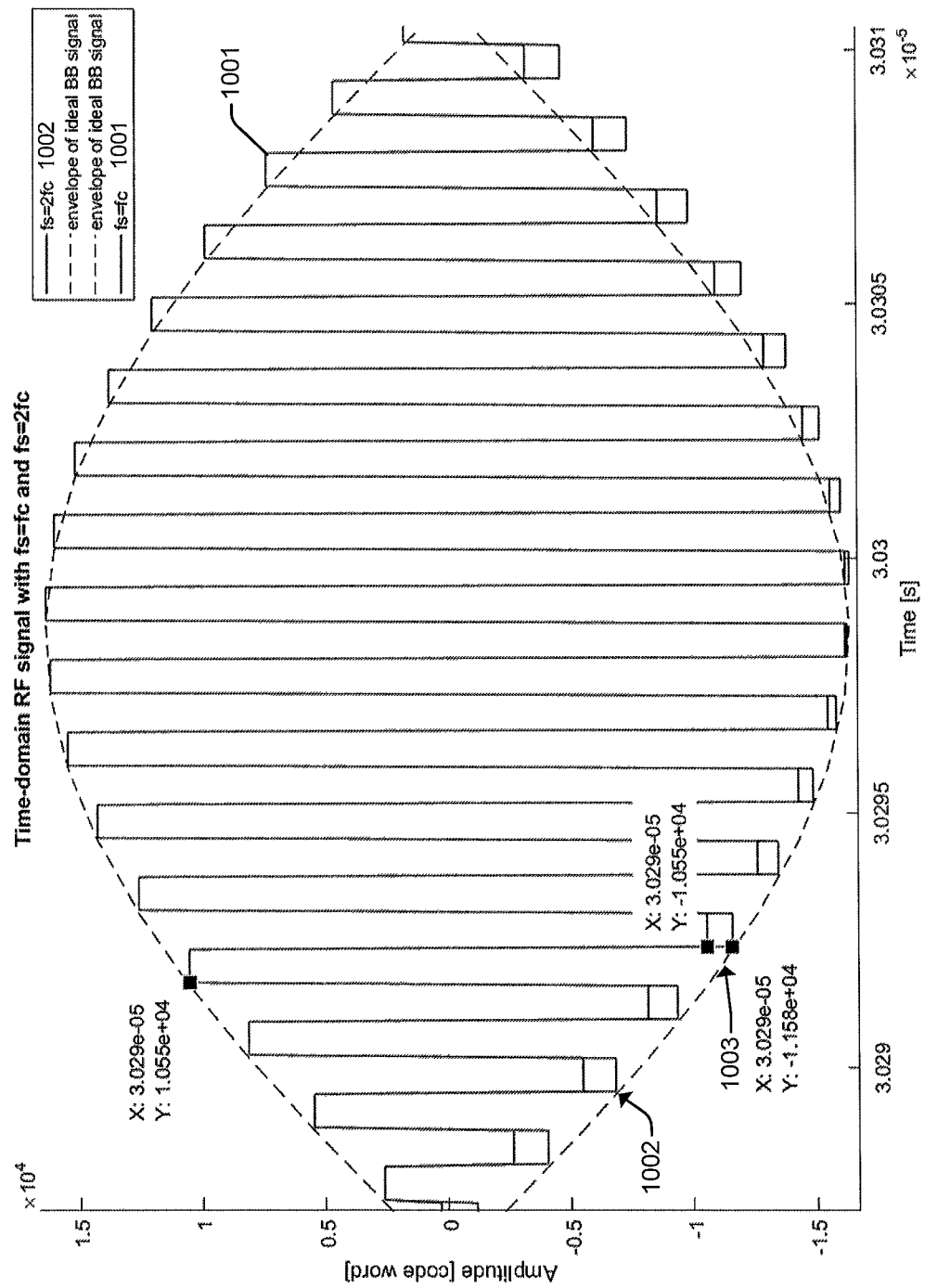
FIG. 10 is a graph illustrating example RF signals generated with various sampling rates in a transmitter system in accordance with one or more embodiments.

FIG. 10 is a graph 1000 illustrating example RF signals generated with various sampling rates in a transmitter system in accordance with one or more embodiments. The graph 1000 is provided as an example for illustrative purposes. It is appreciated that suitable variations are contemplated.

The graph 1000 depicts time along an x-axis and amplitude along a y-axis. An envelope of an ideal signal is shown.

A first RF out signal 1001 is shown for a transmitter system where the RFDAC uses a sampling rate $f_s$ is equal to or at the same frequency as the carrier frequency $f_c$, thus $f_s=f_c$.

A second RF output signal 1002 is shown for a transmitter system where the RFDAC utilizes a sampling rate twice that of the carrier frequency, such as in the example transmitter system 500 shown above. For the signal 1002, $f_s=2f_c$. Here, the RFDAC 506 has an increased sampling rate.

The RF output signal 1001 is shown with gaps or offsets from the envelope of the ideal baseband (BB) signal, particularly on the lower portion.

In contrast, the RF output signal 1002 more closely tracks the envelope of the ideal BB signal.

An example of the variation is shown at 1003, where the RF output signal 1001 has a value of X 3.029e-05 and Y −1.055e+04 and RF signal 1002 has a value of X 3.029e-05 and Y −1.158e+04.

The magnitude of the RF signal, such as 1002, generated using an increased sampling rate, is controlled separately in the first half by 'en 1' and in the second half by 'en 2'. Thus, there are 2 magnitude-updates per one RF cycle, which nets an increase of the sampling frequency to $f_s=2f_c$.

The example of time-domain of 'I' (or 'Q') component of RF signal, generated with (RF signal 1002) and without the increased sampling rate (RF signal 1001) is shown in FIG. 10.

As can be seen, the RF signal 1002 (updating magnitude 2 times per LO cycle) follows the ideal envelope of the baseband signal better than the signal 1001. It is appreciated that the LO and inverted LO_n signals are used. However, both signals may be preexisting in communication systems and/or transmitters.

It is appreciated that the increased sampling rate of the RFDAC 506 also improves the quantization noise-floor without increasing the resolution of the RFDAC. The quantization noise floor improved by 3 dB, in one example. This benefit is inherited by the principally doubled the sampling frequency $f_s=2f_c$, as shown above. For a particular bit-resolution of an RFDAC, a certain amount of the quantization noise power is present. If the sampling frequency of the same signal is doubled, the same amount of the quantization noise power is spread on doubled the bandwidth. This results in halved the power spectral density of the quantization noise, while the wanted signal stay the same, which means that the SNR is improved by 3 dB. This directly improves the in-band performance (EVM) as well as the out-of-band performance and the like. Further, this could potentially reduce the bit-resolution of the RFDAC used for some applications (reducing the area, complexity, power consumption, etc.), but still meeting standard requirements or specifications.

Figure 11:
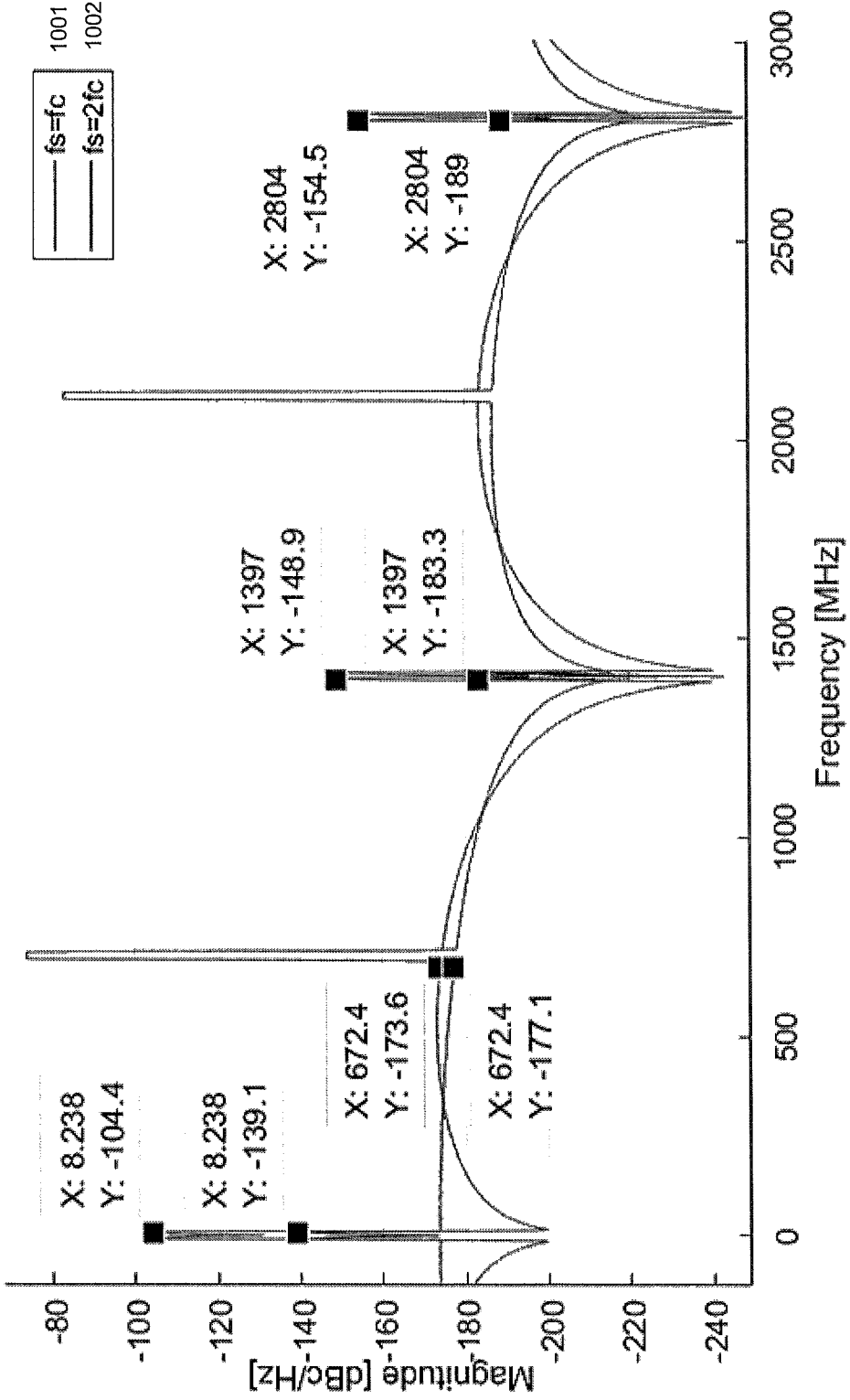
FIG. 11 is a graph illustrating a spectrum of RF output signals in the frequency domain in accordance with one or more embodiments.

FIG. 11 is a graph 1100 illustrating a spectrum of RF output signals in the frequency domain in accordance with one or more embodiments. The graph 1100 is provided as an example for illustrative purposes. It is appreciated that suitable variations are contemplated.

An x-axis depicts frequency and a y axis depicts magnitude.

An RF output signal 1001 is generated by a transmitter using a sampling rate equal to a carrier frequency. A second RF output signal 1002 is generated by a transmitter using a sampling rate twice the carrier frequency.

The results shown in FIG. 11 are just one example, while the same benefits and improvements are present for a wide range of different parameters (BW, RB allocation, carrier frequency, signal type, etc.)

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in a memory, non-volatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a radio frequency digital to analog converter (RFDAC) system for a transmitter. The system includes a cell control circuit and a cell structure. The cell control circuit is configured to generate a first control signal for a first half of a local oscillator (LO) clock cycle of an LO signal and a second control signal for a second half of the LO clock cycle of the LO signal. The cell structure is configured to sample a baseband signal at least twice a frequency of the LO signal and a carrier frequency and generate a radio frequency (RF) output signal based on the first control signal and the second control signal.

Example 2 includes the subject matter of Example 1, including or omitting optional elements, wherein cell structure is configured for differential components or single ended operation.

Example 3 includes the subject matter of any of Examples 1-2, including or omitting optional elements, wherein the cell structure is configured to generate a first sample using a first circuit path and a second sample using a second circuit path during each cycle of the LO signal.

Example 4 includes the subject matter of any of Examples 1-3, including or omitting optional elements, wherein the first circuit path is configured to receive the LO signal and the first control signal and generate the first sample based on the LO signal and the first control signal.

Example 5 includes the subject matter of any of Examples 1-4, including or omitting optional elements, wherein the second circuit path is configured to receive an inverted LO signal and the second control signal and generate the second sample based on the inverter LO signal and the second control signal.

Example 6 includes the subject matter of any of Examples 1-5, including or omitting optional elements, wherein the first circuit path includes and AND gate in series with an inverter, wherein the AND gate is configured to receive the LO signal and the first control signal at its inputs.

Example 7 includes the subject matter of any of Examples 1-6, including or omitting optional elements, wherein the second circuit path includes a second AND gate in series with a second inverter and a third inverter, wherein the second AND gate is configured to receive the inverted LO signal and the second control signal at its inputs.

Example 8 includes the subject matter of any of Examples 1-7, including or omitting optional elements, wherein the cell structure is configured to update an amplitude of the RF output signal twice for each LO clock cycle.

Example 9 includes the subject matter of any of Examples 1-8, including or omitting optional elements, wherein the cell structure generates an interpolated value based on a current sample and one or more previous samples.

Example 10 is a communication system using an increased sampling rate. The communication system includes a baseband signal generator, a phase locked loop (PLL), an interpolator, a cell control circuit, and a radio frequency digital to analog converter (RFDAC). The baseband signal generator is configured to generate a baseband signal. The PLL is configured to generate a local oscillator (LO) signal and an inverted LO signal. The interpolator is configured to generate an interpolated/delayed data stream from a baseband original data stream. The cell control circuit is configured to generate control signals based on the interpolated data stream and the baseband original data stream. The radio frequency digital to analog converter (RFDAC) is configured to generate a radio frequency (RF) output signal from the baseband signal using an increased sampling rate, the LO signal, the inverted LO signal, and the control signals, wherein the increased sampling rate is higher than a frequency of the LO signal.

Example 11 includes the subject matter of Example 10, including or omitting optional elements, wherein the increased sampling rate is twice the frequency of the LO signal.

Example 12 includes the subject matter of any of Examples 10-11, including or omitting optional elements, wherein the increased sampling rate is twice a frequency of a carrier frequency of the RF output signal.

Example 13 includes the subject matter of any of Examples 10-12, including or omitting optional elements, wherein the baseband signal includes one of in-phase components and quadrature components or magnitude.

Example 14 includes the subject matter of any of Examples 10-13, including or omitting optional elements, wherein the increased sampling rate is selected by an RFDAC cell controller of the RFDAC to suppress replicas of the baseband signal for a frequency operating range of a DCO of the PLL and to improve a quantization noise floor by 3 dB.

Example 15 includes the subject matter of any of Examples 10-14, including or omitting optional elements, wherein the RFDAC is configured to update an amplitude of the RF output signal twice per cycle of the LO signal.

Example 16 includes the subject matter of any of Examples 10-15, including or omitting optional elements, wherein the RFDAC is configured to generate interpolated values based on consecutive samples.

Example 17 is a method of generating a radio frequency (RF) output signal using an increased sampling rate. The method includes generating a baseband signal by a baseband signal generator; generating a local oscillator (LO) signal and an inverted LO signal by a phase locked loop (PLL); generating interpolated values by a radio frequency digital to analog converter (RFDAC) based on consecutive samples of the baseband signal and one or more control signals; and combining the interpolated values with the consecutive samples to generate the RF output signal.

Example 18 includes the subject matter of Example 17, including or omitting optional elements, further comprising generating the one or more control signals based on an original data stream and an interpolated data stream.

Example 19 includes the subject matter of any of Examples 17-18, including or omitting optional elements, wherein the generated interpolated values and the consecutive samples provide a sampling rate of twice a carrier frequency of the RF output signal.

Example 20 includes the subject matter of any of Examples 17-19, including or omitting optional elements, wherein the RFDAC includes a one bit shifter, a register and an adder.

It is to be understood that aspects described herein can be implemented by hardware, software, firmware, or any combination thereof. When implemented in software, functions can be stored on or transmitted over as one or more instructions or code on a computer-readable medium. Computer-readable media includes both computer storage media and communication media including any medium that facilitates transfer of a computer program from one place to another. A storage media or a computer readable storage device can be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or other tangible and/or non-transitory medium, that can be used to carry or store desired information or executable instructions. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Additionally, at least one processor can comprise one or more modules operable to perform one or more of the s and/or actions described herein.

For a software implementation, techniques described herein can be implemented with modules (e.g., procedures, functions, and so on) that perform functions described herein. Software codes can be stored in memory units and executed by processors. Memory unit can be implemented within processor or external to processor, in which case memory unit can be communicatively coupled to processor through various means as is known in the art. Further, at least one processor can include one or more modules operable to perform functions described herein.

Techniques described herein can be used for various wireless communication systems such as CDMA, TDMA, FDMA, OFDMA, SC-FDMA and other systems. The terms "system" and "network" are often used interchangeably. A CDMA system can implement a radio technology such as Universal Terrestrial Radio Access (UTRA), CDMA1800, etc. UTRA includes Wideband-CDMA (W-CDMA) and other variants of CDMA. Further, CDMA1800 covers IS-1800, IS-95 and IS-856 standards. A TDMA system can implement a radio technology such as Global System for Mobile Communications (GSM). An OFDMA system can implement a radio technology such as Evolved UTRA (E-UTRA), Ultra Mobile Broadband (UMB), IEEE 802.11 (Wi-Fi), IEEE 802.16 (WiMAX), IEEE 802.18, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA1800 and UMB are described in documents from an organization named "3rd Generation Partnership Project 2" (3GPP2). Further, such wireless communication systems can additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein can be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product can include a computer readable medium having one or more instructions or codes operable to cause a computer to perform functions described herein.

Communications media embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

Further, the actions of a method or algorithm described in connection with aspects disclosed herein can be embodied directly in hardware, in a software module executed by a processor, or a combination thereof. A software module can reside in RAM memory, flash memory, ROM memory, EPROM memory, EEPROM memory, registers, a hard disk, a removable disk, a CD-ROM, or any other form of storage medium known in the art. An exemplary storage medium can be coupled to processor, such that processor can read information from, and write information to, storage medium. In the alternative, storage medium can be integral to processor. Further, in some aspects, processor and storage medium can reside in an ASIC. Additionally, ASIC can reside in a user terminal. In the alternative, processor and storage medium can reside as discrete components in a user terminal. Additionally, in some aspects, the s and/or actions of a method or algorithm can reside as one or any combination or set of codes and/or instructions on a machine-readable medium and/or computer readable medium, which can be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

What is claimed is:

1. A communication system using an increased sampling rate comprising:
    a baseband signal generator configured to generate a baseband signal;
    a phase locked loop (PLL) configured to generate a local oscillator (LO) signal and an inverted LO signal;
    an interpolator configured to generate an interpolated/delayed data stream from a baseband original data stream;
    a cell control circuit configured to generate control signals based on the interpolated data stream and the baseband original data stream; and
    a radio frequency digital to analog converter (RFDAC) configured to generate a radio frequency (RF) output signal from the baseband signal using an increased sampling rate, the LO signal, the inverted LO signal, and the control signals, wherein the increased sampling rate is higher than a frequency of the LO signal.

2. The system of claim 1, wherein the increased sampling rate is twice the frequency of the LO signal.

3. The system of claim 1, wherein the increased sampling rate is twice a frequency of a carrier frequency of the RF output signal.

4. The system of claim 1, wherein the baseband signal includes one of in-phase components and quadrature components or magnitude.

5. The system of claim 1, wherein the increased sampling rate is selected by an RFDAC cell controller of the RFDAC to suppress replicas of the baseband signal for a frequency operating range of a DCO of the PLL and to improve a quantization noise floor by 3 dB.

6. The system of claim 1, wherein the RFDAC is configured to update an amplitude of the RF output signal twice per cycle of the LO signal.

7. The system of claim 1, wherein the RFDAC is configured to generate interpolated values based on consecutive samples.

8. A method of generating a radio frequency (RF) output signal using an increased sampling rate, the method comprising:
- generating a baseband signal by a baseband signal generator;
- generating a local oscillator (LO) signal and an inverted LO signal by a phase locked loop (PLL);
- generating interpolated values by a radio frequency digital to analog converter (RFDAC) based on consecutive samples of the baseband signal and one or more control signals; and
- combining the interpolated values with the consecutive samples to generate the RF output signal.

9. The method of claim 8, further comprising generating the one or more control signals based on an original data stream and an interpolated data stream.

10. The method of claim 8, wherein the generated interpolated values and the consecutive samples provide a sampling rate of twice a carrier frequency of the RF output signal.

11. The method of claim 8, wherein the RFDAC includes a one bit shifter, a register and an adder.

\* \* \* \* \*